(12) United States Patent
Cho

(10) Patent No.: US 6,287,964 B1
(45) Date of Patent: *Sep. 11, 2001

(54) METHOD FOR FORMING A METALLIZATION LAYER OF A SEMICONDUCTOR DEVICE

(75) Inventor: Young A. Cho, Chungcheongbuk-do (KR)

(73) Assignee: Hyundai Electronics Industries Co., Ltd., Ichon-shi (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 57 days.

(21) Appl. No.: 09/158,794

(22) Filed: Sep. 23, 1998

(30) Foreign Application Priority Data

Jan. 26, 1998 (KR) .................................................. 98/2329

(51) Int. Cl.$^7$ ................................................... H01L 21/283
(52) U.S. Cl. ........................... 438/643; 438/644; 438/672; 257/763
(58) Field of Search ..................................... 438/643, 644, 438/645, 654, 653, 655, 712, 713, 726, 672; 257/763, 752, 758, 750, 753, 52

(56) References Cited

U.S. PATENT DOCUMENTS

| | | | |
|---|---|---|---|
| 4,892,843 | 1/1990 | Schmitz et al. | 437/192 |
| 5,409,861 | * 4/1995 | Choi | 38/675 |
| 5,470,792 | * 11/1995 | Yamada | 38/675 |
| 5,489,552 | * 2/1996 | Merchant et al. | 38/675 |
| 5,654,233 | * 8/1997 | Yu | 438/643 |
| 5,661,080 | * 8/1997 | Hwang et al. | 257/763 |
| 5,668,064 | * 9/1997 | Park et al. | 38/675 |
| 5,804,249 | * 1/2000 | Sukharev et al. | 427/99 |
| 6,016,009 | * 1/2000 | Sukharev et al. | 257/763 |

* cited by examiner

Primary Examiner—Charles Bowers
Assistant Examiner—Laura M Schillinger
(74) Attorney, Agent, or Firm—Fleshner & Kim, LLP

(57) ABSTRACT

A method for forming a metallization layer of a semiconductor device prevents leakage current and electrical shorts between adjacent metallization lines. The method includes the steps of: forming an insulating film having a contact hole on a semiconductor substrate; forming a barrier metal layer on an entire surface of the insulating film including inner surfaces of the contact hole; forming a semiconductor layer on a surface of the barrier metal layer; forming a first conductive layer to generate an overhang at an upper portion of the contact hole; removing the overhang of the first conductive layer; and forming a second conductive layer on the first conductive layer, including on inside surfaces of the contact hole.

21 Claims, 5 Drawing Sheets

METHOD FOR FORMING A METALLIZATION LAYER OF A SEMICONDUCTOR DEVICE

BACKGROUND OF THE INVENTION

1. Field of the Invention

The present invention relates to a method for forming a metallization layer of a semiconductor device.

2. Background of the Related Art

In a metal oxide semiconductor (MOS) device, metallization layers can be used to form or to interconnect a gate electrode, source and drain impurity diffused regions, a contact region, and each device with one another. Characteristics of an electrode metallization layer depend on the device feature dimensions, and the power source voltage. The resistance of a gate electrode increases as the number of features on a given chip increase. Capacitance also increases as metallization layer pitch is reduced. This, in turn, decreases signal transmission speed, thereby reducing an operation speed of the device.

Since resistance of a contact region can increase as much as $K^2$, where K is the number of individual devices on a chip, and since current density can increase by a factor of K, reliability of a metallization layer deteriorates as K increases. In addition, the reliability of a metallization layer can deteriorate due to electromigration (EM) effects. For these reasons, a material of low resistance is typically used to form a gate electrode, which can serve as a word line of a memory. The resistivity of doped polysilicon is typically greater than 200 $\mu\Omega$·cm. If polysilicon is used as a material of a gate electrode, when the device dimensions are less than 1 $\mu$m, operation speed is reduced due to a delay in signal transmission, thereby deteriorating reliability of the semiconductor device.

To reduce resistance, a tungsten silicide $WSi_x$ film may be used to form a gate electrode. The tungsten silicide $WSi_x$ film has excellent step coverage, and its resistivity is about 100 $\mu\Omega$·cm. Also, a $WSi_x$ film may be easily deposited on polysilicon. In other words, polycide (polysilicon+refractory silicide) may be used as a gate electrode. However, it is known that a $WSi_x$ film having a resistivity of about 100 $\mu\Omega$·cm fails to sufficiently reduce resistance if the dimensions of a gate electrode are less than about 0.5 $\mu$m. To solve the resistivity problem, the use of other metallization layer materials such as W (resistivity of 10 $\mu\Omega$·cm or less), $TiSi_2$ (resistivity of 20 $\mu\Omega$·cm or less), $COSi_2$ (resistivity of 20 $\mu\Omega$·cm or less), and TiN (resistivity of 30 $\mu\Omega$·cm or less) have been studied.

Further, as the packing density of a semiconductor device increases, an aspect ratio of a contact hole for electrical connection of devices increases. The increased aspect ratio has also caused problems with step coverage.

A background art method for forming a metallization layer of a semiconductor device will be described with reference to FIGS. 1A to 1C, which are sectional views illustrating process steps of forming a metallization layer of a semiconductor device. As shown in FIG. 1A, an oxide film 2 is first deposited on a semiconductor substrate 1, and a photoresist PR is deposited on the oxide film 2. A region where a contact hole will be formed is then defined, and the photoresist PR in the region is selectively patterned by exposure and developing processes. Subsequently, the oxide film 2 is selectively removed, by an etching process using the patterned photoresist PR as a mask, so that a contact hole 3 is formed to expose the semiconductor substrate 1. At this time, the oxide film 2 forms an interlayer dielectric layer (ILD).

As shown in FIG. 1B, the photoresist PR is removed. A barrier metal layer 4 of Titanium(Ti)/Titanium Nitride (TiN) is then formed on the semiconductor substrate 1 in the contact hole 3 and on an entire surface of the oxide film 2. The barrier metal layer 4 is to prevent characteristics of a metallization layer, which will be formed later, from being varied.

For contact holes having a high aspect ratio, an overhang can occur at predetermined portions on sides A of the contact hole 3, or at a corner portion B of the bottom of the contact hole 3. In other words, the barrier metal layer 4 may not be fully deposited at the corner portion B of the bottom of the contact hole 3. Such an overhang frequently occurs when forming contact holes of a memory device with a capacity of 64M or more. Thus, the oxide film 2 is often exposed at the corner portion B of the bottom of the contact hole 3.

To prevent such an overhang from occurring, a collimator may be used to fully deposit the barrier metal layer 4 on the bottom corners of the contact hole 3. Alternatively, a deposition time may be extended to ensure the barrier metal layer 4 is deposited on the corner portion B of the bottom of the contact hole 3.

As shown in FIG. 1C, a tungsten layer 5 is then formed on an entire upper surface of the barrier metal layer 4, by a chemical vapor deposition (CVD) method. In the CVD method, a chemical material, which includes atoms of a material to be deposited, is provided to a reaction chamber. The chemical material (in a gas state) is reacted with another gas in the reaction chamber to generate a desired material. The desired material is then deposited on a surface of the substrate, and unnecessary materials (including gas) are exhausted from the reaction chamber.

The process steps of forming the tungsten layer 5 will be described in detail. First, a seed layer (not shown) of amorphous silicon is formed on the barrier metal layer 4 by flowing $SiH_4$ gas on the entire surface of the substrate. The reaction path is $SiH_4$ (gas)→amorphous $Si+2H_2$ (gas). During this step, $SiH_4$ gas flows for about five seconds at 25 Standard Cubic Centimeter per Minute (SCCM).

Subsequently, both $SiH_4$ gas and $WF_6$ gas flow on the barrier metal layer 4, and a first portion of the tungsten layer 5 is deposited. The reaction path is $3SiH_4$ (gas)+$2WF_6$ (gas)→$2W+3SiF_4+6H_2$ (gas). The tungsten layer 5 has property of 2 W. The tungsten (2 W) has a relatively fast deposition ratio and excellent adhesion.

A second portion of the tungsten layer 5 is then deposited on the first portion of tungsten at a slower deposition rate. In this step, $H_2$ gas and $WF_6$ gas flow on the first portion of the tungsten layer 5, and the second portion of the tungsten layer 5 is deposited by the reaction path $3H_2(gas)+WF_6$ (gas) →$W+6HF$ (gas). The second portion of the tungsten layer is deposited at a slower deposition rate to achieve better step coverage.

The background art method for forming a metallization layer of a semiconductor device has several problems. Because the barrier metal layer 4 has an overhang, when the tungsten layer 5 is deposited on the barrier metal layer 4, a void 6 may be formed in the tungsten layer 5.

Also, $WF_6$ gas may come into contact with TiN of the barrier metal layer in the contact hole during the course of the chemical reaction that occurs when depositing the tungsten layer. The $WF_6$ gas may react with Ti, thereby generating $TiF_3$ gas. The $TiF_3$ gas may cause sparking to occur, which may cause an electrical short between adjacent metallization layers if an interval between the metallization layers is small. In addition, because the substrate may remain exposed at bottom corners of the contact hole 3, $WF_6$ gas may directly diffuse into the semiconductor substrate. As a result, leakage current may occur, and characteristics of the device are deteriorated.

A collimator may be used to reduce the overhang effect, or a deposition time of the barrier metal layer may be increased to ensure the barrier metal layer is formed across an entire bottom surface of the contact hole 3. However, if the collimator is used, the formation process time increases. Also, if the deposition time of the barrier metal layer is increased to ensure the barrier metal layer covers the bottom corners of the contact hole, the overhang problem may become worse.

If the barrier metal layer is not formed at the corner portions of the bottom of the contact hole, $WF_6$ gas may be distributed into the interface between Ti (in the barrier metal layer) and the oxide film in the contact hole during the chemical reaction for deposition of the tungsten layer. Fluorine (F) of the $WF_6$ gas causes poor adhesion of the interface between the oxide film and the Ti, thereby deteriorating reliability in metallization of the semiconductor device.

SUMMARY OF THE INVENTION

It is an object of the present invention to substantially obviate at least the problems or disadvantages of the background art.

Another object of the present invention is to prevent an electrical short from forming between metallization lines.

A further object of the present invention is to improve the reliability of the device.

To achieve these and other advantages and in accordance with the purpose of the present invention, a method for forming a metallization layer comprising the steps of: forming an insulating film having a contact hole on a substrate; forming a barrier layer on the insulating film, including an inner surface of the contact hole; forming a semiconductor layer on a surface of the barrier layer; forming a first conductive layer having an overhang on the semiconductor layer; removing at least a portion of the overhang of the first conductive layer; and forming a second conductive layer in the contact hole.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

Preferred embodiments of the invention will be described in conjunction with the following drawing figures, wherein like reference numbers refer to like elements, and wherein.

DETAILED DESCRIPTION OF PREFERRED EMBODIMENTS

Figure 1A:
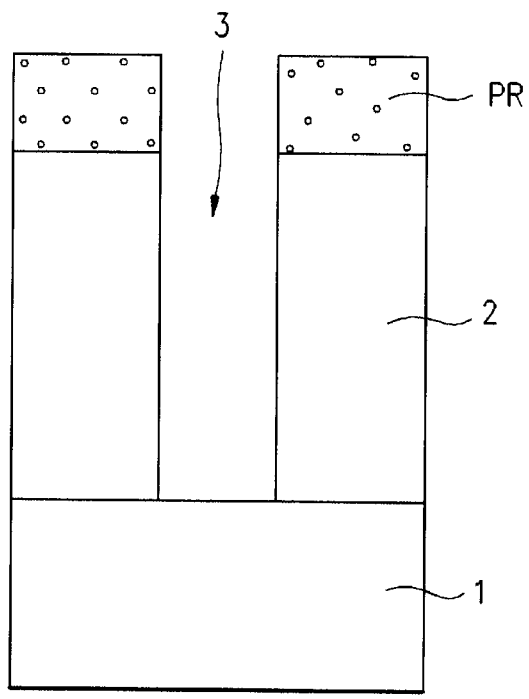
FIGS. 1A to 1C are sectional views illustrating process steps of a background art method of forming a metallization layer of a semiconductor device.
Figure 1B:
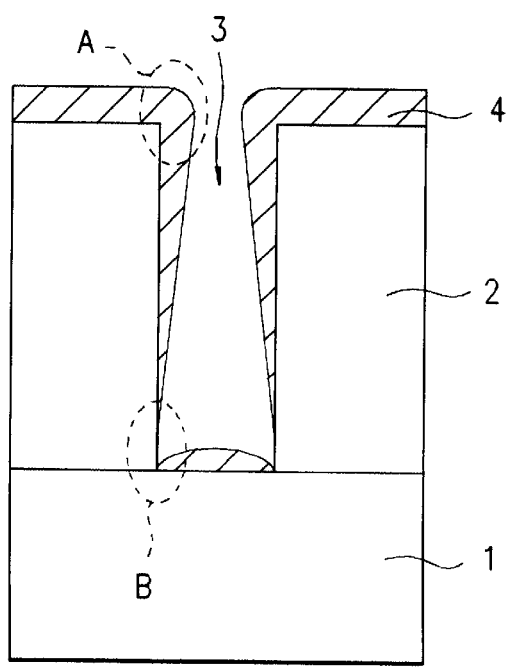
Figure 1C:
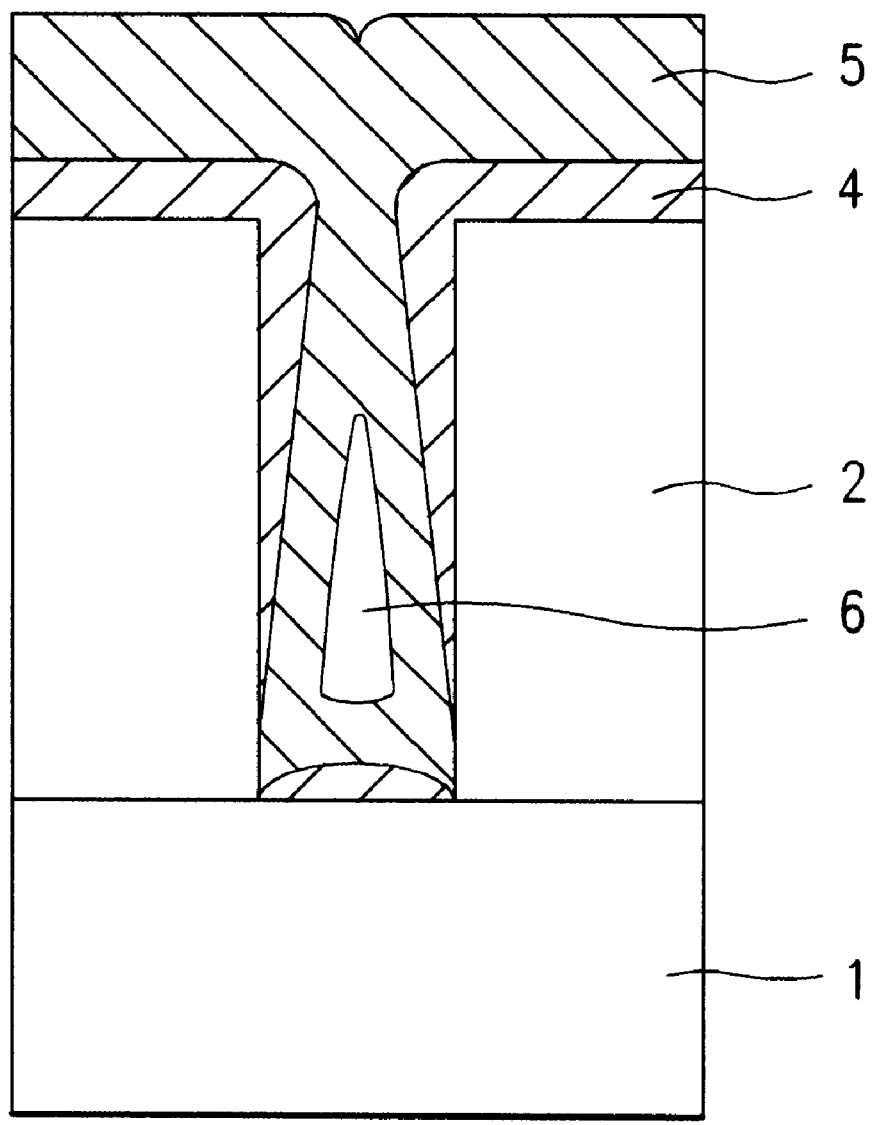
Figure 2A:
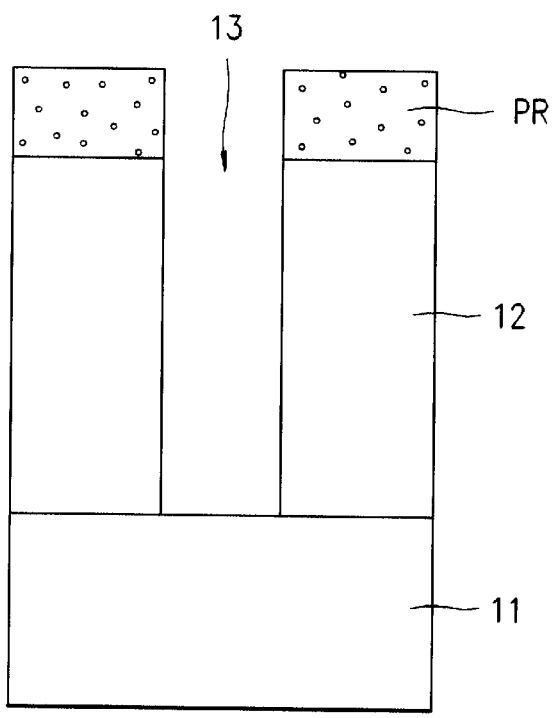
FIGS. 2A to 2F are sectional views illustrating process steps of a method of forming a metallization layer of a semiconductor device according to the present invention.

As shown in FIG. 2A, an ILD layer 12 is deposited on a semiconductor substrate 11 and a photoresist PR is deposited on the ILD layer 12. A region where a contact hole will be formed is then defined and the photoresist PR in the region is selectively patterned by exposure and developing processes. Subsequently, the ILD layer 12 is selectively removed by an etching process, using the patterned photoresist PR as a mask, so that a contact hole 13 is formed to expose the semiconductor substrate 11. If the contact hole 13 is part of a memory device having a capacity of 64M or more, an aspect ratio of the contact hole 13 may be more than 4, and its critical dimensions may be less than 0.4 $\mu$m.

Figure 2B:
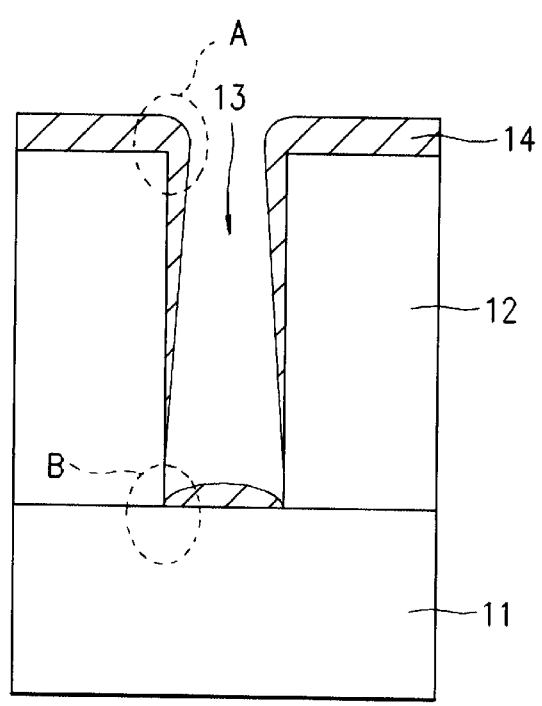

As shown in FIG. 2B, the photoresist PR is then removed. A barrier metal layer 14 of Ti/TiN is formed on an entire surface of the device, including an upper surface of the semiconductor substrate 11, and inside the contact hole 13. An overhang occurs in the barrier metal layer 14 at upper portions A of the contact hole 13. The overhang A can cause problems in forming the barrier metal layer 14 at the corner portion B of the bottom of the contact hole 13. In general, such an overhang occurs when forming any film in the contact hole. In particular, however, an overhang tends to occur more frequently when fabricating a memory device having a capacity of 64M or more. Sides of the ILD layer 12, and the substrate 11 surface at a lower portion of the ILD layer 12 are exposed at the corner portion B of the bottom of the contact hole 13.

Figure 2C:
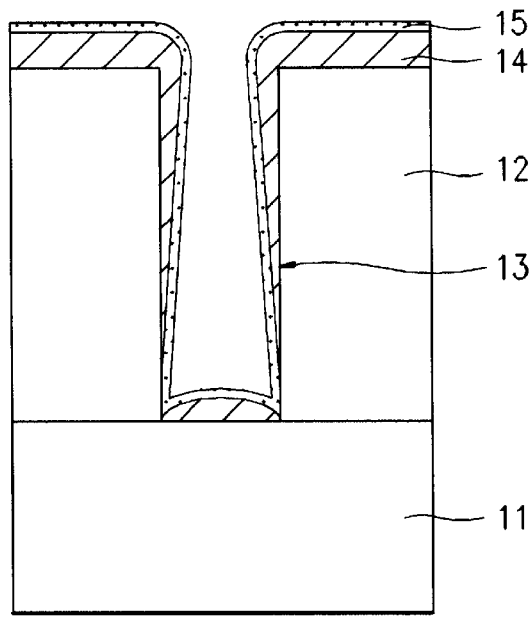

As shown in FIG. 2C, an amorphous silicon layer 15 is then formed on the barrier metal layer 14, including inside the contact hole 13. In the background art process described above, an amorphous silicon seed layer is formed with a $SiH_4$ gas flow of a duration of about five seconds at flow rate of 25 SCCM. However, in a preferred embodiment of the present invention, a thicker amorphous silicon layer 15 is formed on the barrier metal layer 14 by either increasing the flow rate of the $SiH_4$ gas, or increasing the duration of the flow time of the $SiH_4$ gas, or both. In this case, the reaction path is $SiH_4$ (gas)→amorphous Si+$2H_2$ (gas). The amorphous silicon layer 15 is formed on the sides of the ILD layer 12 at the bottom of the contact hole 13 where the barrier metal layer 14 will not form, and at the corner portion of the bottom of the contact hole 13. The amorphous silicon layer 15 has a thickness of approximately 200 Å~300 Å.

Figure 2D:
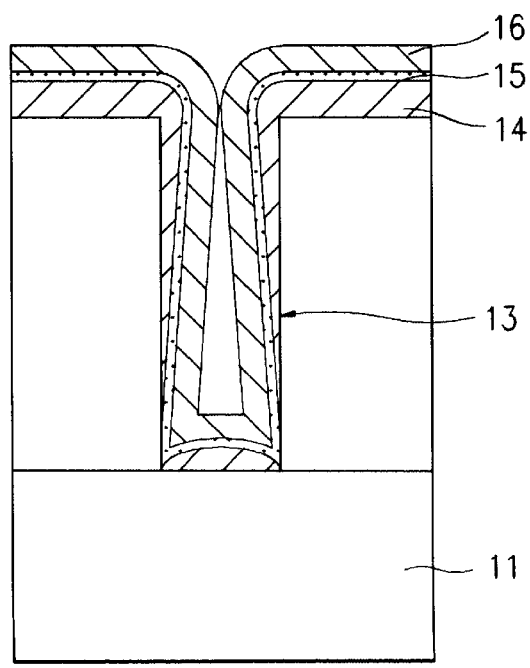

As shown in FIG. 2D, $SiH_4$ gas and $WF_6$ gas flow on the amorphous silicon layer 15, and a first tungsten layer 16 is deposited on the amorphous silicon layer 15. The reaction path is $3SiH_4$ (gas)+$2WF_6$2W+$3SiF_4$ (gas)+$6H_2$ (gas). Note that the amorphous silicon layer 15 and the first tungsten layer 16 can be formed by first introducing $SiH_4$ gas into the reaction chamber for a period of time necessary to form the amorphous silicon layer 15, then also introducing the $WF_6$ gas to form the first tungsten layer 16.

Since the tungsten layer 16 has a relatively fast deposition ratio (2 W) and excellent adhesion, an overhang occurs, as shown in FIG. 2D. The first tungsten layer 16 is deposited on the amorphous silicon layer 15 until the contact hole 13 is completely plugged.

Figure 2E:
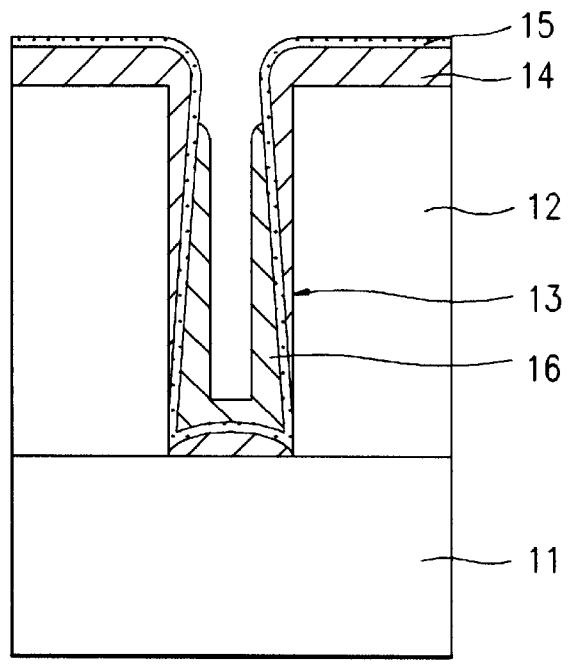

As shown in FIG. 2E, a portion of the first tungsten layer 16 in the contact hole 13, in which overhang occurs, is then selectively removed. This is accomplished by introducing a flow of $WF_6$ gas. The reaction path is $WF_6$ (gas)+W→$WF_5$ (gas). At this time, the first tungsten layer 16 over the amorphous silicon layer 15 at the top of the contact hole 13 is removed. However, when the upper portion of the contact hole 13 is completely plugged by the first tungsten layer 16, because of the overhang that occurs when the first tungsten layer 16 is deposited, unnecessary etching or removal of the first tungsten layer 16 formed in the inside of the contact hole 13 can be avoided.

Figure 2F:
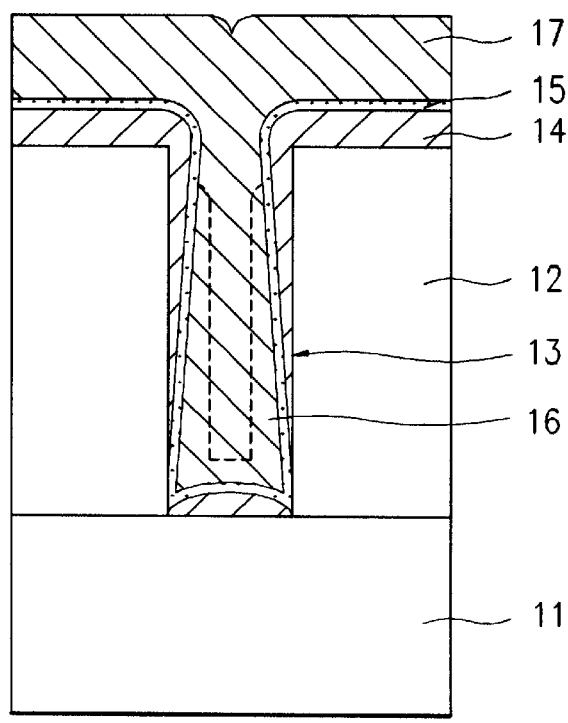

As shown in FIG. 2F, a second tungsten layer 17 is then formed on the amorphous silicon layer 15 and the first tungsten layer 16. The second tungsten layer 17 is formed by the reaction path $3H_2$ (gas)+$WF_6$ (gas)→W+6HF (gas) in such a manner that both $WF_6$ gas and $H_2$ gas flow in the reaction chamber. The process steps shown in FIGS. 2C to 2F can be carried out consecutively in the same reaction chamber.

After forming the second tungsten layer 17, portions of the second tungsten layer 17 formed at locations other than the contact hole 13 may be selectively removed to form a tungsten plug. Subsequently process step for forming a metallization layer such as aluminum or its alloy can be performed. In other words, the tungsten layers 16 and 17 may be selectively patterned by photolithography etching for use as a metallization line. Alternatively, after forming a tungsten plug of the tungsten layers 16 and 17, a metallization material layer such as an aluminum or its alloy may be formed on the tungsten plug.

The method for forming a metallization layer of a semiconductor device according to the present invention has several advantages. Since the amorphous silicon layer is formed on the entire inner surface of the contact hole, even if the barrier metal layer is not formed on the corner portion of the bottom in the contact hole, $WF_6$ gas cannot be diffused into TiN of the barrier metal layer, or into the semiconductor substrate. This, in turn, prevents an electrical short from forming between adjacent metallization layers, even where the interval between the metallization layers is small. Further, since nothing diffuses into the substrate, leakage current does not occur, and the semiconductor device has a high reliability. If an overhang occurs during the course of process steps of forming the tungsten layer, the portion where the overhang occurs is selectively removed. Therefore, it is possible to form a metallization without overhang and without a void.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for forming an interconnecting layer comprising the steps of:
    forming an insulating film having a contact hole on a substrate;
    forming a barrier layer on the insulating film, including an inner surface of the contact hole;
    forming a semiconductor layer on the barrier layer to prevent diffusion into the barrier layer and the substrate during subsequent processing steps;
    forming a first conductive layer having an overhang on the semiconductor layer;
    removing at least a portion of the overhang of the first conductive layer; and
    forming a second conductive layer on the first conductive layer.

2. The method of claim 1, wherein the step of forming an insulating film comprises forming an insulating film having a contact hole with an aspect ratio of approximately 4 or more, and a critical dimension of approximately 0.4 µm or less.

3. The method of claim 1, wherein the step of forming a semiconductor layer comprises forming an amorphous silicon layer.

4. The method of claim 3, wherein the step of forming a semiconductor layer comprises forming an amorphous silicon layer having a thickness of between approximately 200 Å and approximately 300 Å.

5. The method of claim 1, wherein the steps of forming the semiconductor layer, forming the first conductive layer, removing at least a portion of the overhang of the first conductive layer, and forming the second conductive layer are carried out sequentially in the same reaction chamber.

6. The method of claim 5, wherein the step of forming the second conductive layer comprises forming the second conductive layer such that it has a property different than the first conductive layer.

7. The method of claim 6, wherein the steps of forming the first and second conductive layers comprise forming the first conductive layer of a material having a deposition ratio that is greater than a deposition ratio of the material of the second conductive layer.

8. The method of claim 5, wherein the steps of forming the first and second conductive layers comprise forming the first and the second conductive layers of the same type of material.

9. The method of claim 8, wherein the steps of forming the first and second conductive layers comprise forming the first and second conductive layers of tungsten.

10. The method of claim 1, wherein the step of forming the barrier layer comprises forming the barrier such that it does not cover all surfaces inside the contact hole.

11. The method of claim 1, wherein the step of forming a first conductive layer comprises forming an overhang at an upper portion of the contact hole.

12. The method of claim 1, wherein the step of forming a first conductive layer comprises forming the first conductive layer such that it substantially plugs an upper portion of the contact hole.

13. The method of claim 1, further comprising the step of removing a portion of the second conductive layer that is not located in the contact hole.

14. The method of claim 13, further comprising the step of forming a metallization material layer on the remaining portion of the second conductive layer.

15. The method of claim 1, wherein the step of forming the semiconductor layer comprises flowing $SiH_4$ gas on the substrate after the barrier layer is formed.

16. The method of claim 15, wherein the step of forming the first conductive layer comprises reacting $SiH_4$ gas and $WF_6$ gas.

17. The method of claim 16, wherein the step of forming a first conductive layer comprises substantially plugging the contact hole by reacting $SiH_4$ gas and $WF_6$ gas.

18. The method of claim 17, wherein the step of removing at least a portion of the overhang of the first conductive layer comprises flowing $WF_6$ gas on the first conductive layer.

19. The method of claim 18, wherein the step of forming a second conductive layer comprises flowing $SiH_4$ gas.

20. The method of claim 18, wherein the step of removing at least a portion of the overhang of the first conductive layer comprises removing all of the first conductive layer at an upper portion of the contact hole to expose the barrier metal layer.

21. The method of claim 1, wherein the step of forming an insulating film comprises forming an oxide film, wherein the step of forming a barrier layer comprises forming a barrier layer of at least one of Ti and TiN, wherein the step of forming a semiconductor layer comprises forming an amorphous silicon layer on the barrier layer, and wherein the steps of forming the first and second conductive layers comprise forming first and second layers of W on the amorphous silicon layer.

* * * * *